United States Patent
Nakayama

(10) Patent No.: US 10,930,469 B2
(45) Date of Patent: *Feb. 23, 2021

(54) CHARGED PARTICLE BEAM WRITING APPARATUS AND CHARGED PARTICLE BEAM WRITING METHOD

(71) Applicant: NuFlare Technology, Inc., Yokohama (JP)

(72) Inventor: Takahito Nakayama, Chigasaki (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/160,174

(22) Filed: Oct. 15, 2018

(65) Prior Publication Data

US 2019/0122858 A1    Apr. 25, 2019

(30) Foreign Application Priority Data

Oct. 20, 2017 (JP) .............................. JP2017-203668

(51) Int. Cl.
    *H01J 37/317*    (2006.01)
    *G03F 9/00*      (2006.01)
    *H01J 37/304*    (2006.01)

(52) U.S. Cl.
    CPC ........ *H01J 37/3174* (2013.01); *G03F 9/7015* (2013.01); *G03F 9/7026* (2013.01);
    (Continued)

(58) Field of Classification Search
    CPC ......... H01J 37/3045; H01J 2237/20292; H01J 2237/30472; H01J 2237/1502;
    (Continued)

(56) References Cited

U.S. PATENT DOCUMENTS

| 5,757,015 A * | 5/1998 | Takemoto | .............. | B82Y 10/00 |
|               |        |          |                | 250/491.1  |
| 8,748,843 B2 * | 6/2014 | Tsuruta  | .............. | H01J 37/3045 |
|               |        |          |                | 250/252.1  |

(Continued)

FOREIGN PATENT DOCUMENTS

| CN | 1607640 A   | 4/2005 |
| CN | 103257529 A | 8/2013 |

(Continued)

OTHER PUBLICATIONS

Combined Taiwanese Office Action and Search Report dated Sep. 9, 2019 in Taiwanese Patent Application No. 107133110 (with unedited computer generated English translation), 16 pages.

(Continued)

*Primary Examiner* — David A Vanore
(74) *Attorney, Agent, or Firm* — Oblon, McClelland, Maier & Neustadt, L.L.P.

(57) ABSTRACT

In one embodiment, a charged particle beam writing apparatus includes a writer writing a pattern on a substrate placed on a stage by irradiating the substrate with a charged particle beam, a height detector detecting a surface height of a mark on the stage, an irradiation position detector detecting an irradiation position of the charged particle beam on the mark surface by irradiation with the charged particle beam focused at the surface height of the mark, a drift correction unit calculating an amount of drift of the charged particle beam on the mark surface from the irradiation position detected by the irradiation position detector, and generating correction information for correcting a shift in irradiation position caused by a drift on the substrate surface based on the amount of drift, and a writing control unit correcting the irradiation position of the charged particle beam by using the correction information.

4 Claims, 4 Drawing Sheets

(52) U.S. Cl.
CPC ........ *G03F 9/7076* (2013.01); *H01J 37/3045* (2013.01); *H01J 2237/103* (2013.01); *H01J 2237/30455* (2013.01); *H01J 2237/31788* (2013.01)

(58) Field of Classification Search
CPC ..... H01J 2237/2448; H01J 2237/24578; H01J 2237/2826; H01J 37/3005
USPC .... 250/492.22, 491.1, 252.1, 309, 310, 397, 250/492.2, 492.3, 548, 557; 257/E21.334, E21.336
See application file for complete search history.

(56) References Cited

U.S. PATENT DOCUMENTS

| | | | | |
|---|---|---|---|---|
| 8,859,997 | B2* | 10/2014 | Kamikubo | H01J 37/3174 250/492.2 |
| 2003/0094584 | A1* | 5/2003 | Yui | B82Y 10/00 250/492.22 |
| 2005/0072941 | A1 | 4/2005 | Tanimoto et al. | |
| 2007/0045534 | A1* | 3/2007 | Zani | B82Y 10/00 250/309 |
| 2012/0211676 | A1* | 8/2012 | Kamikubo | H01J 37/3174 250/492.22 |
| 2013/0037724 | A1* | 2/2013 | Tsuruta | B82Y 10/00 250/397 |
| 2013/0214172 | A1 | 8/2013 | Touya et al. | |
| 2015/0060690 | A1 | 3/2015 | Yashima | |
| 2016/0093466 | A1 | 3/2016 | Mizoguchi | |
| 2016/0111252 | A1 | 4/2016 | Motosugi | |
| 2017/0169993 | A1* | 6/2017 | Iizuka | H01J 37/3177 |
| 2019/0122859 | A1* | 4/2019 | Nakayama | H01J 37/3045 |

FOREIGN PATENT DOCUMENTS

| | | |
|---|---|---|
| JP | 09-246135 | 9/1997 |
| JP | 2001-168013 | 6/2001 |
| JP | 2002-093678 | 3/2002 |
| JP | 2003-272996 | 9/2003 |
| JP | 2013-038297 | 2/2013 |
| JP | 2014-123613 | 7/2014 |
| JP | 2016-134486 | 7/2016 |
| KR | 10-2009-0102661 A | 9/2009 |
| KR | 10-2011-0087401 A | 8/2011 |
| TW | 201514635 A | 4/2015 |
| TW | 201626419 A | 7/2016 |

OTHER PUBLICATIONS

Korean Office Action dated Mar. 18, 2020 in Patent Application No. 10-2018-0121791 (with English translation), 20 pages.
Taiwanese Office Action and Search Report dated May 14, 2020 in corresponding Taiwanese Application No. 107133110 (with English translation), 9 pages.
Chinese Office Action dated Jun. 30, 2020 in corresponding Chinese Patent Application No. 201811213408.1 (with English translation), 22 pages.
Korean Office Action dated Oct. 12, 2020 in corresponding Korean Patent Application No. 10-2018-0121791, 10 pages.
Taiwanese Office Action dated Oct. 15, 2020 in corresponding Taiwanese Patent Application No. 107133110, 6 pages.

* cited by examiner

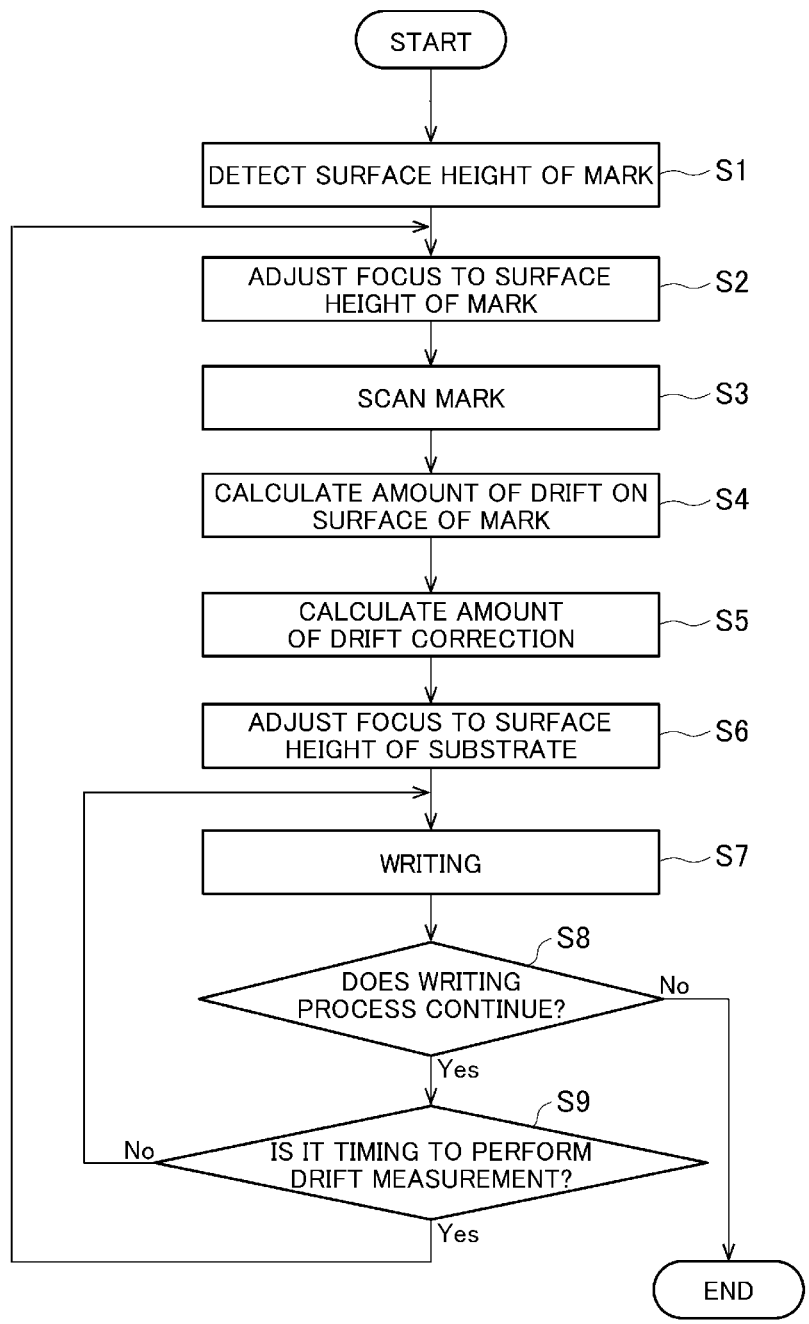

CHARGED PARTICLE BEAM WRITING APPARATUS AND CHARGED PARTICLE BEAM WRITING METHOD

CROSS REFERENCE TO RELATED APPLICATION

This application is based upon and claims benefit of priority from the Japanese Patent Application No. 2017-203668, filed on Oct. 20, 2017, the entire contents of which are incorporated herein by reference.

FIELD

The present invention relates to a charged particle beam writing apparatus and a charged particle beam writing method.

BACKGROUND

As LSI circuits are increasing in density, the line width of circuits of semiconductor devices is becoming finer. To form a desired circuit pattern onto a semiconductor device, a method of reducing and transferring, by using a reduction-projection exposure apparatus, onto a wafer a highly precise original image pattern (mask, or reticle, in particular, when used in a stepper or a scanner) formed on a quartz is employed. The highly precise original image pattern is written by using an electron beam writing apparatus, in which a technology commonly known as electron beam lithography is used.

In the electron beam writing apparatus, a phenomenon called beam drift may occur in which, due to various factors, the irradiation position of the electron beam shifts over time during writing. A drift correction is made to cancel out the beam drift. In the drift correction, a measurement mark on a mark substrate disposed on a stage is scanned with an electron beam, and the irradiation position of the electron beam is measured to determine the amount of drift.

Each sample (mask), which is a writing target, has a different thickness because of the tolerance. Normally, the surface height of the sample differs from the surface height of the mark substrate. When the electron beam enters the sample or mark substrate at an angle, the difference in surface height causes an error between the amount of drift on the mark surface and the amount of drift on the sample surface. If the amount of drift on the mark surface is used as it is to make a drift correction, the error described above results in insufficient drift correction.

Patent Literature 1 (Japanese Unexamined Patent Application Publication No. 2013-38297) discloses a technique that reduces the shift of the beam irradiation position depending on the difference in height between the sample surface and the mark surface. The disclosed technique involves providing a plurality of marks of different heights on a stage, selecting a mark lower in height than the sample surface and a mark higher in height than the sample surface, and determining the amount of drift on the sample surface using the amounts of drift on the respective surfaces of the two selected marks.

However, the technique disclosed in Patent Literature 1 lowers the writing throughput, because it requires scanning of at least two marks with the electron beam and measurement of the amount of drift on each of the two marks.

BRIEF DESCRIPTION OF THE DRAWINGS

FIG. 6 is a flowchart illustrating a writing method according to the embodiment.

DETAILED DESCRIPTION

In one embodiment, a charged particle beam writing apparatus includes a writer writing a pattern on a substrate by irradiating the substrate with a charged particle beam, the substrate being a writing target placed on a stage, a mark on the stage, a height detector detecting a surface height of the mark, a focus adjusting unit adjusting a focus of the charged particle beam in accordance with a surface height of the substrate and the detected surface height of the mark, an irradiation position detector detecting an irradiation position of the charged particle beam on the mark surface by irradiation with the charged particle beam focused at the surface height of the mark, a drift correction unit calculating an amount of drift of the charged particle beam on the mark surface from the irradiation position detected by the irradiation position detector, and generating correction information for correcting a shift in irradiation position caused by a drift on the substrate surface based on the amount of drift, and a writing control unit correcting the irradiation position of the charged particle beam by using the correction information.

An embodiment of the present invention will be described below with reference to the drawings. In the embodiment, a configuration using an electron beam as an example of a charged particle beam will be described. The charged particle beam is not limited to the electron beam. For example, the charged particle beam may be an ion beam.

Figure 1:
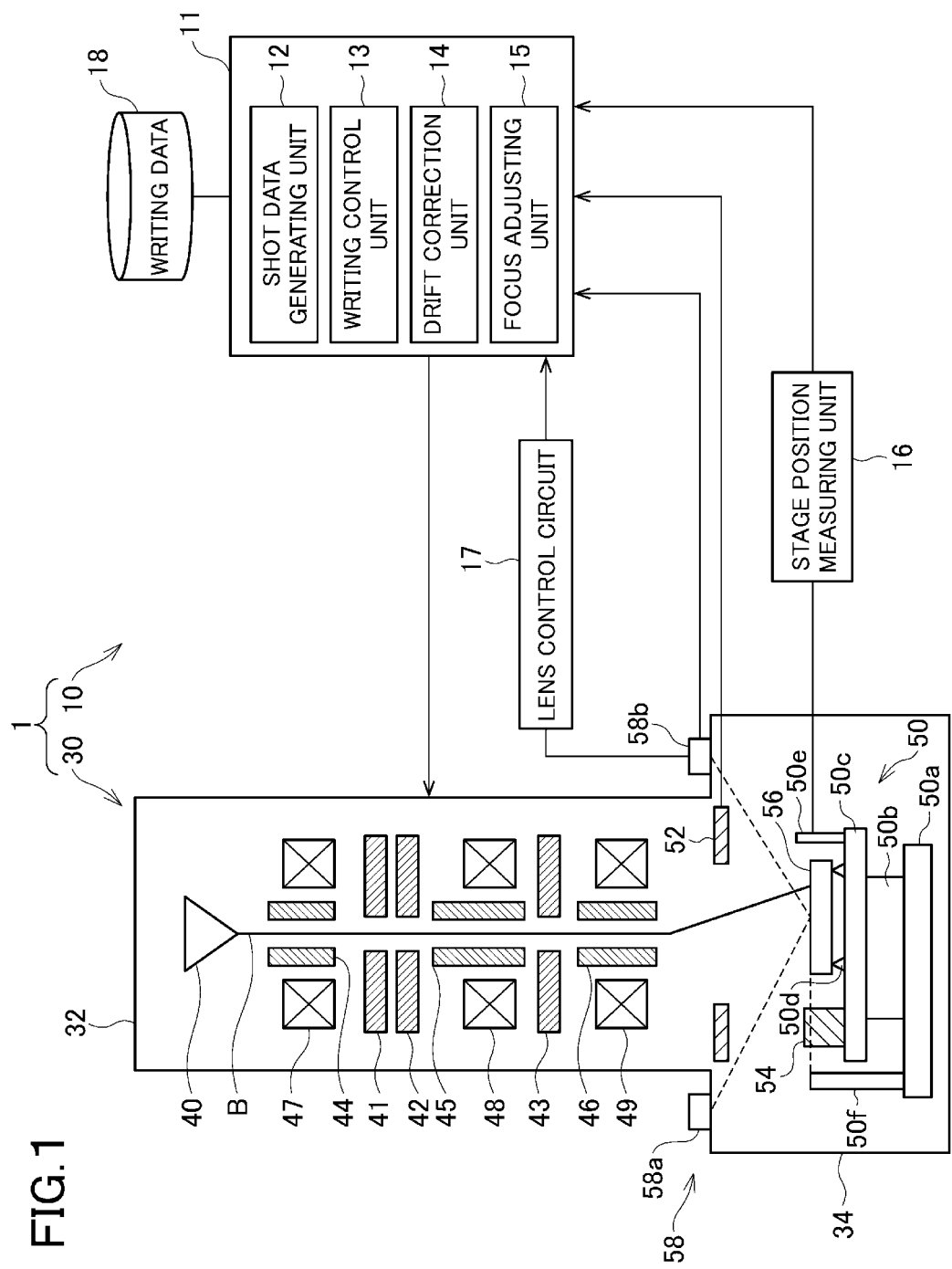
FIG. 1 is a schematic diagram of an electron beam writing apparatus according to an embodiment of the present invention.

FIG. 1 is a schematic diagram of an electron beam writing apparatus according to an embodiment of the present invention. A writing apparatus 1 illustrated in FIG. 1 is a writing apparatus of a variable shaping type that includes a writer 30 and a controller 10. The writer 30 writes a desired pattern on a substrate 56 (writing target) by irradiating it with an electron beam, and the controller 10 controls the operation of the writer 30.

The writer 30 includes a column 32 and a writing chamber 34. The column 32 includes therein an electron gun 40, a blanking aperture member (plate) 41, a first shaping aperture member 42, a second shaping aperture member 43, a blanking deflector 44, a shaping deflector 45, an objective deflector 46, an illuminating lens 47, a projection lens 48, and an objective lens 49. The objective lens 49 is a dynamic focusing lens capable of adjusting the focus position in the Z-axis direction. Examples of the dynamic focusing lens include an electrostatic lens and an electromagnetic lens. For changing the focus position during writing, an electrostatic lens free from hysteresis is used.

The writing chamber 34 includes a stage 50 movably disposed therein. The substrate 56 is placed on the stage 50. Examples of the substrate 56 include an exposure mask used in manufacturing semiconductor devices, a mask blank, and a semiconductor substrate (silicon wafer) on which semiconductor devices are manufactured.

The stage 50 includes an XY stage 50a movable in the X direction and the Y direction that are orthogonal to each other in a horizontal plane, and a base 50c disposed above the XY stage 50a. The base 50c is configured such that it can be moved by a drive unit 50*b* in the Z direction orthogonal to the X direction and the Y direction. The substrate 56 is supported on the base 50*c* by a plurality of support pins 50*d* therebetween. The stage 50 is capable of adjusting the position of the substrate 56 in the X direction, Y direction, and Z direction.

The base 50*c* is provided with a mirror 50*e* and a mark 54 on the surface thereof. The mirror 50*e* is for measuring the position of the stage 50 (base 50*c*) in the horizontal plane, and the mark 54 is for measuring the amount of drift of an electron beam B. The mark 54 is, for example, a cross-shaped or dot-shaped mark of heavy metal, such as tantalum or tungsten, formed on a silicon substrate. There may be a plurality of marks 54 of different heights. The mark 54 does not necessarily need to be of a reflective type, and a mark of a transmissive type may be used. The transmissive type requires a mark with an opening and a current measuring device that measures the amount of electron current transmitted through the opening.

The XY stage 50*a* is provided with a reference height member 50*f* that serves as a height reference for the surface of the substrate 56 (sample surface). By focusing the electron beam B onto the surface of the reference height member 50*f* and making the surface of the reference height member 50*f* flush with the surface of the substrate 56, the electron beam B can be focused onto the surface of the substrate 56.

An irradiation position detector 52 is disposed above the stage 50. By irradiating the mark 54 with the electron beam B, the irradiation position detector 52 detects the irradiation position (beam position) of the electron beam B. Examples of the irradiation position detector 52 include an electron detector. When the mark 54 is scanned by the electron beam B, the electron detector detects electrons reflected from the mark 54 as a current value. The detected beam position is sent to a control computer 11 (described below).

The outer periphery of the writing chamber 34 is provided with a height detector 58 that detects the surface height of the substrate 56 and the surface height of the mark 54. The height detector 58 does not necessarily need to be of a particular type. For example, the height detector 58 may be of a type that includes a light projector 58*a* configured to obliquely irradiate the surface of the substrate 56 and the surface of the mark 54 with laser light from above, and a light receiver 58*b* configured to receive the reflected light. From the light receiving position at which the light receiver 58*b* has received the reflected light, the height detector 58 can detect the surface height of either the substrate 56 or the mark 54. The detected surface height is sent to the control computer 11.

The controller 10 includes the control computer 11, a stage position measuring unit 16, a lens control circuit 17, and a storage device 18. The control computer 11 includes a shot data generating unit 12, a writing control unit 13, a drift correction unit 14, and a focus adjusting unit 15. Data input to and output from each unit of the control computer 11 and data used during computation are appropriately stored in a memory (not shown).

These units of the control computer 11 may be configured either by hardware or software. When these units are configured by software, programs that implement at least some of their functions may be stored in a recording medium, such as a CD-ROM, and loaded into and executed by a computer including an electric circuit.

The storage device 18 (storage unit) stores writing data therein. The writing data is obtained by converting layout data, which represents the arrangement of designed graphic patterns, into a format in which the data can be input to the writing apparatus 1.

The shot data generating unit 12 reads the writing data from the storage device 18 and performs multiple stages of data conversion to generate shot data specific to the apparatus. The shot data defines, for example, graphic type, graphic size, irradiation position, and irradiation time. On the basis of the shot data, the writing control unit 13 controls the writer 30 to perform a writing process.

The drift correction unit 14 calculates the amount of drift on the surface of the substrate 56 and determines the amount of drift correction for cancelling out the drift. A method for calculating the amount of drift will be described later on. On the basis of the amount of drift correction, the drift correction unit 14 generates correction information for correcting the amount of deflection (beam irradiation position) of the electron beam B and supplies the correction information to the writing control unit 13. The writing control unit 13 controls the writer 30 using the correction information to correct the beam irradiation position.

The stage position measuring unit 16 includes a laser length measuring machine that measures the position of the stage 50 by sending and receiving laser light to and from the mirror 50*e* secured on the base 50*c* of the stage 50. The stage position measuring unit 16 notifies the control computer 11 of the measured stage position.

The lens control circuit 17 controls the objective lens 49 on the basis of a control signal from the focus adjusting unit 15, and adjusts the focus position of the electron beam B.

FIG. 1 shows components necessary to explain the embodiment. The writing apparatus 1 may include other components that are typically required.

When the electron beam B emitted from the electron gun 40 in the column 32 passes through the blanking deflector 44, the blanking deflector 44 deflects the electron beam B in such a manner that the electron beam B is passed through the blanking aperture member 41 in the beam-on state and is entirely blocked by the blanking aperture member 41 in the beam-off state. The electron beam B that is passed through the blanking aperture member 41 after transition from the beam-off state to the beam-on state before being turned off is defined as one electron beam shot.

Figure 2:
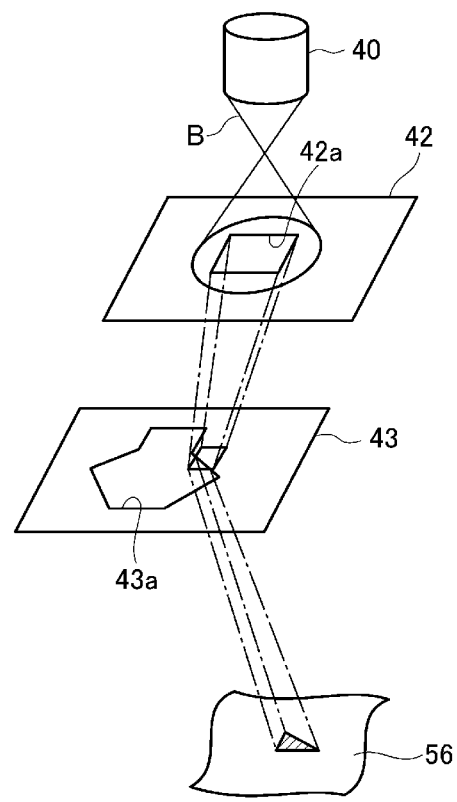
FIG. 2 illustrates variable shaping of an electron beam.

The electron beam B in each shot generated by passing through the blanking deflector 44 and the blanking aperture member 41 is directed by the illuminating lens 47 onto the first shaping aperture member 42 having a rectangular opening 42*a* (see FIG. 2). By passing through the opening 42*a* in the first shaping aperture member 42, the electron beam B is formed into a rectangular shape.

The electron beam passing through the first shaping aperture member 42 to form a first shaping aperture image is projected by the projection lens 48 onto the second shaping aperture member 43. The position of the first aperture shaping image on the second shaping aperture member 43 is controlled by the shaping deflector 45. This varies the shape and dimensions (i.e., enables variable shaping) of the electron beam passing through an opening 43*a* in the second shaping aperture member 43.

The electron beam passed through the second shaping aperture member 43 is brought into focus by the objective lens 49, deflected by the objective deflector 46, and applied to a desired point of the substrate 56 on the stage 50.

Figure 3A:
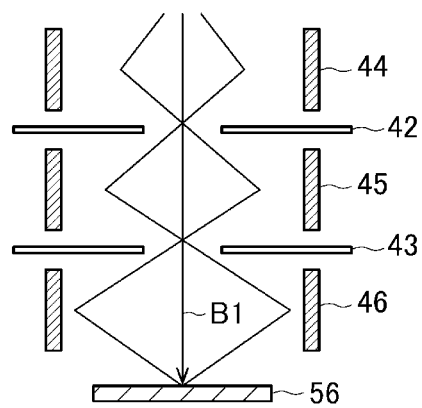
FIG. 3A illustrates a beam trajectory in a normal state.
Figure 3B:
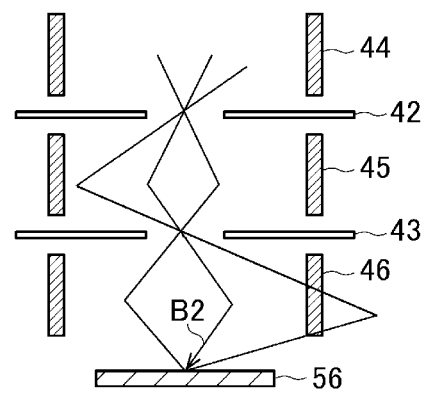
FIG. 3B illustrates a trajectory of a beam entering at an angle.

In the writing apparatus 1, it is desirable, as in the case of a beam B1 illustrated in FIG. 3A, that the beam be applied (substantially) perpendicularly to the substrate 56. However, for example, due to instability of various amplifiers, axial displacement of the electron gun 40, or beam drift caused by charge-up, the beam axis is tilted as in the case of a beam B2 illustrated in FIG. 3B.

Figure 4:
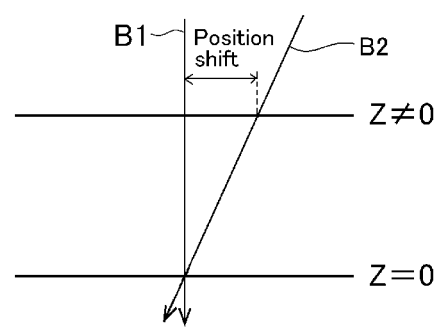
FIG. 4 illustrates an exemplary beam trajectory.

As illustrated in FIG. 4, in the case of the beam B1 with no tilt in the beam axis, there is no shift in beam position between the surface level of the substrate 56 where the beam is focused (Z=0) and the level where the beam is defocused (Z≠0). On the other hand, in the case of the beam B2 with a tilt in the beam axis, the difference in the height of the beam irradiation surface causes a shift in beam position.

For example, when the surface height of the substrate 56 differs from the surface height of the mark 54, the beam B2 with a tilt in the beam axis has an error in irradiation position between the substrate 56 and the mark 54. This causes an error between the amount of drift on the surface of the mark 54 and the amount of drift on the surface of the substrate 56. If the amount of drift on the surface of the mark 54 is used, as it is, as the amount of drift on the surface of the substrate 56 to make a drift correction, the error described above results in insufficient drift correction.

Figure 5:
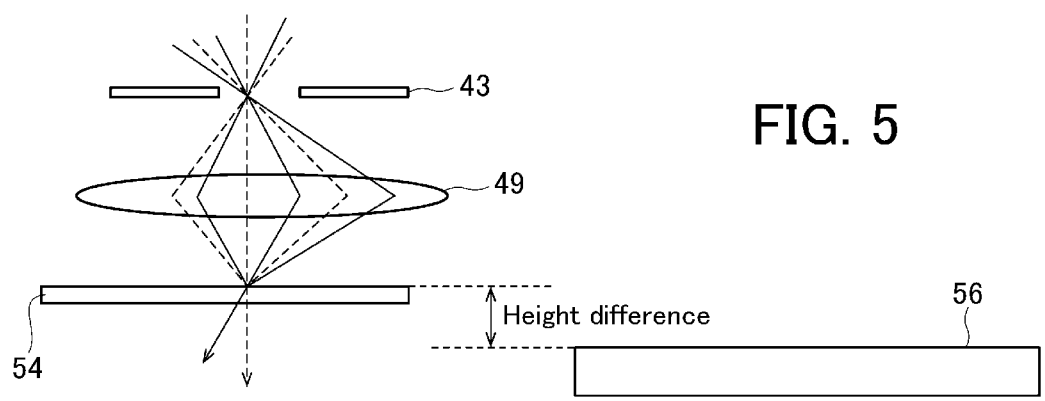
FIG. 5 is a schematic diagram of an electron beam focused on a mark surface.

Accordingly, in the present embodiment, the focus position of the objective lens 49 is shifted and the amount of drift on the surface of the mark 54 is measured after the focus is adjusted onto the surface of the mark 54 as illustrated in FIG. 5. This reduces the shift of the beam irradiation position caused by the difference in height between the surface of the mark 54 and the surface of the substrate 56, and makes it possible to determine the amount of drift on the surface of the substrate 56 with high accuracy.

A writing method including such a drift correction process will be described using the flowchart of FIG. 6. The drift correction process is performed at predetermined time intervals during the writing process. When the beam is unstable (e.g., immediately after start of writing), the drift correction is performed at shorter intervals, which are gradually increased over time. Before start of the writing process, the height detector 58 detects the surface height of the substrate 56. The writing control unit 13 controls the drive unit 50b of the stage 50 to make the surface of the reference height member 50f flush with the surface of the substrate 56.

Before drift correction, first, the height detector 58 detects the surface height of the mark 54 (step S1). The detected mark surface height may be stored in the storage unit so that it can be referred to in subsequent drift corrections.

The focus adjusting unit 15 moves the focus position of the objective lens 49 to adjust the focus to the surface height of the mark 54 (step S2). For example, by using a plurality of marks of different heights, the level of sensitivity of the focus height to exciting current for the objective lens 49 is determined in advance. By controlling the exciting current in accordance with the mark surface height detected in step S1, the focus can be adjusted to the surface height of the mark 54.

After the stage 50 is moved to adjust the mark 54 to the center position of the objective lens 49, the mark 54 is scanned with the electron beam B (step S3).

The irradiation position detector 52 detects the reflected electrons, measures the beam profile, and detects the beam irradiation position. By the drift correction unit 14, the amount of deviation between the detected beam irradiation position and a reference position is calculated as the amount of drift on the surface of the mark (step S4).

The mark 54 is scanned by the electron beam B focused at the surface height of the mark 54. Therefore, even if the beam axis is tilted, a shift in beam irradiation position caused by the difference in height between the surface of the mark 54 and the surface of the substrate 56 is reduced. The amount of drift on the surface of the mark 54 can thus be regarded as the amount of drift on the surface of the substrate 56.

On the basis of the amount of drift on the surface of the mark 54, the drift correction unit 14 calculates the amount of drift correction (step S5).

The focus adjusting unit 15 adjusts the focus position of the objective lens 49 to move it back to the surface height of the substrate 56 (step S6).

On the basis of writing data read from the storage device 18 and the amount of drift correction calculated, the writing control unit 13 performs a writing process while correcting the beam irradiation position (step S7). Until the next measurement of the amount of drift (YES in step S8, NO in step S9), the writing process using the amount of drift calculated in step S5 continues to be performed.

In the present embodiment, as described above, the amount of drift is determined by scanning the mark 54 with a beam focused at the surface height of the mark 54. This reduces an error between the amount of drift on the mark surface and the amount of drift on the substrate surface. It is thus possible to make a drift correction with high accuracy and improve accuracy in pattern writing. The amount of drift can be determined simply by scanning one mark 54. Therefore, the level of writing throughput achieved here is higher than that achieved when scanning a plurality of marks.

The embodiment described above is an example where the focus position of the objective lens 49 is shifted to scan the mark 54. Alternatively, the focus adjusting unit 15 may control the drive unit 50b of the stage 50 to change the stage height in such a manner that the surface of the mark 54 is adjusted to the focus position.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A charged particle beam writing method for writing a pattern on a substrate by adjusting a charged particle beam using a single mark on a stage and irradiating the substrate with the charged particle beam, the substrate being a writing target placed on the stage, the charged particle beam writing method comprising:
    detecting a surface height of the single mark;
    detecting an irradiation position of the charged particle beam on a surface of the single mark by irradiation with the charged particle beam focused at a surface height of the single mark;
    calculating an amount of drift of the charged particle beam on the surface of the single mark using the detected irradiation position;
    calculating a correction amount for correcting a shift in irradiation position caused by a drift on a surface of the substrate, by the amount of drift on the surface of the single mark; and
    correcting the irradiation position of the charged particle beam by using the calculated correction amount,
    wherein before irradiating the single mark, the charged particle beam is focused onto the surface of the single mark by using an objective lens.

2. The method according to claim 1, wherein before the charged particle beam irradiates the single mark, the stage is controlled in such a manner that the surface height of the single mark is adjusted to a focus of the charged particle beam.

3. The method according to claim 1, wherein after irradiating the single mark, the charged particle beam is focused onto the surface of the substrate.

4. The writing method according to claim 1, wherein a beam axis of the charged particle beam that irradiates the single mark is tilted.

* * * * *